United States Patent

Kowalski et al.

[11] Patent Number: 6,034,446
[45] Date of Patent: Mar. 7, 2000

[54] PROGRAMMABLE SWITCH, ADJUSTABLE CAPACITANCE AND RESONANT CIRCUIT EFFECTED BY MEANS OF SUCH A SWITCH

[75] Inventors: Jacek Kowalski, Trets; Michel Martin, Rognes, both of France

[73] Assignee: Inside Technologies, Saint Clément les Places, France

[21] Appl. No.: 09/226,546

[22] Filed: Jan. 7, 1999

Related U.S. Application Data

[63] Continuation of application No. PCT/FR97/01258, Oct. 7, 1997.

[30] Foreign Application Priority Data

Jul. 31, 1996 [FR] France ................................. 96 09910

[51] Int. Cl.[7] ................................................. H03K 3/00
[52] U.S. Cl. .......................... 307/112; 307/125; 327/564
[58] Field of Search ............................. 307/112, 116, 307/125, 130, 131, 139, 143; 327/564, 565; 361/748, 761, 763; 364/468.24, 468.28

[56] References Cited

U.S. PATENT DOCUMENTS

| | | | |
|---|---|---|---|
| 4,814,640 | 3/1989 | Miyake | 327/564 |
| 5,396,527 | 3/1995 | Schecht et al. | 377/57 |
| 5,521,590 | 5/1996 | Hanaoka et al. | 340/825.54 |
| 5,821,525 | 10/1998 | Takebayashi | 235/492 |

FOREIGN PATENT DOCUMENTS

| | | |
|---|---|---|
| 0 281 142 A2 | 9/1988 | European Pat. Off. . |
| 04042615 | 2/1992 | European Pat. Off. . |
| 28 51 789 A 1 | 6/1980 | Germany . |
| 6084384 | 3/1994 | Japan . |

*Primary Examiner*—Jeffrey Gaffin
*Assistant Examiner*—Peter Zura
*Attorney, Agent, or Firm*—Akin, Gump, Strauss, Hauer & Feld, L.L.P.

[57] ABSTRACT

The invention concerns an integrated circuit comprising a resonant circuit ($L$,20) for receiving by electromagnetic induction an alternating voltage ($V_{ac}$), the resonant circuit comprising at least one capacitance (C1–Ci) switchable by means of a programmed switch (11), the switch comprising a circuit breaker (7), a memory cell (6) and a circuit (31, 32, 33, 42) for controlling the circuit beaker (7), the control circuit being supplied by the alternating voltage ($V_{ac}$) and arranged for opening or closing the circuit breaker (7) depending on the programming or the erasing status of the memory cell (6).

9 Claims, 2 Drawing Sheets

6,034,446

PROGRAMMABLE SWITCH, ADJUSTABLE CAPACITANCE AND RESONANT CIRCUIT EFFECTED BY MEANS OF SUCH A SWITCH

CROSS-REFERENCE TO RELATED APPLICATION

This application is a continuation of International Application PCT/FR97/01258, filed Oct. 7, 1997, the disclosure of which is incorporated herein by reference.

BACKGROUND OF THE INVENTION

The present invention relates to the connection of electrical components in integrated circuits.

In integrated circuits, or electronic chips, some electrical components like capacitors, resistors or any other passive or active element involved in the working of the circuit must be accurately calibrated. Such an accuracy cannot be achieved during the foundry process and these components are therefore precisely adjusted after the manufacture of the chips. FIG. 1 illustrates a conventional method of adjusting, for example, a capacitor. In parallel with a primary capacity Cm, low value adjusting capacities C1, C2, ... Ci are provided, the whole forming an equivalent capacity equal to the sum of the capacities Cm, C1, C2, ... Ci. Once the chip has been manufactured, the equivalent capacity is precisely adjusted by cutting, by means of a laser beam, one or several conducting lines p1, p2, . . . pi coupling the adjusting capacities to the primary capacity.

This method has the drawback that it is heavy to implement, and requires costly testing means and machines, as well as a significant amount of working time.

Another drawback of this method is that, for handling reasons, the cutting of the conducting lines is performed when the chips are still collectively present on the silicon mother plate, called "wafer". However, at this stage, some elements, which have sometimes to be taken into account for adjusting, are not yet connected to the chips. In particular, the electronic chip of a contactless chip card or of an electronic label supplied by electromagnetic induction comprises a circuit of the LC type (inductive-capacitive) whose resonance frequency must be tuned to the oscillating frequency of an inducting magnetic field which enables the working of the chip. As the coil L of the LC circuit is generally soldered to the chip during the last manufacturing stage, adjusting the capacity C on the wafer does not allow to compensate the manufacture tolerances of the coil L and to obtain the accurate value LC. Furthermore, various stray capacities appearing when the chip is supplied are not taken into account.

In the prior art, the Japanese Abstract JP6084384 describes a clock circuit whose time base is determined by capacities in parallel able to be commutated by switches controlled by non-volatile memory cells. Also, the U.S. Pat. No. 4,814,640 describes a programmable component comprising a plurality of parallel components commutated by switches controlled by programmable memory cells.

An idea of the present invention is to provide a programmable capacity in the LC resonant circuit of a contactless electronic chip, so as to tune the LC circuit by programming the capacity at the moment when the chip is put into service.

SUMMARY OF THE INVENTION

Thus, an object of the present invention is to provide a programmable electronic component able to operate with an AC voltage, and in particular a programmable capacity able to be integrated in a resonant circuit.

Another object of the present invention is to provide a programmable switching device able to switch AC voltages, and in particular AC voltages having a higher value than the normal working voltage of an integrated circuit.

These objects are achieved by providing an integrated circuit comprising a resonant circuit for receiving, by electromagnetic induction, an AC voltage constituting the source of energy of the integrated circuit, wherein the resonant circuit comprises at least a capacity able to be switched by means of a programmable switching device comprising a switch, a memory cell, and a circuit for controlling the switch supplied by the AC voltage and designed to open or close the switch depending on the programming or erasing state of the memory cell.

According to one embodiment, the integrated circuit comprises means with a low filtering capacity for rapidly rectifying the AC voltage, in order to produce a reading voltage of the memory cell.

According to one embodiment, the integrated circuit comprises means for automatically programming the programmable switching device, in order to receive the highest AC voltage.

The present invention also relates to a programmable switching device for switching an AC electrical voltage, comprising at least a non-volatile memory cell, at least a switching means for switching the AC voltage, wherein the control means comprise means for producing at least a first half-wave of the AC signal, according to the programming state of the memory cell.

According to one embodiment, the output of the control means feeds the switching means by means of a first terminal of a capacity.

Advantageously, the second terminal of the capacity is designed to receive the other half-wave of the AC signal.

According to one embodiment, the switching means comprises a MOS transistor.

According to one embodiment, the memory cell is electrically erasable and programmable.

According to one embodiment, the memory cell comprises a floating gate transistor.

The present invention also relates to a programmable electrical component, comprising at least an electrical component able to be switched by means of a programmable switching device according to the invention.

The present invention also relates to a programmable capacity, comprising at least one capacity able to be switched by means of a programmable switching device according to the invention.

The present invention also relates to a resonant circuit of the LC type, comprising at least one coil and one capacity able to be switched by means of a programmable switching device according to the invention.

These characteristics and advantages, as well as others of the present invention, will be described with more details in the following description of a programmable switching device according to the present invention and of an application of this switching device to the implementation of a programmable capacity and a resonant circuit according to the invention, in conjunction with the accompanying drawings, in which:

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiment(s) which are presently preferred. It should be understood, however, that the invention is not limited to the precise arrangements and instrumentalities shown. In the drawings.

DETAILED DESCRIPTION OF THE INVENTION

Figure 1:
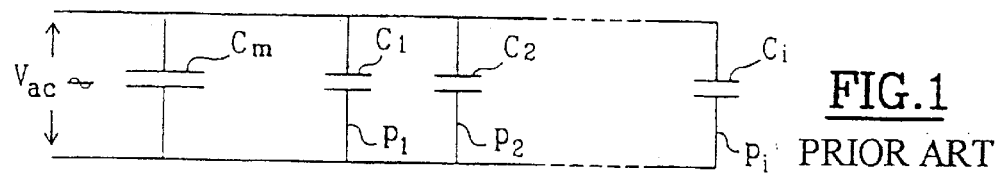
FIG. 1, already described, represents a conventional adjustable capacity.
Figure 2:
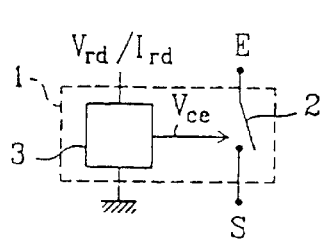
FIG. 2 represents schematically a programmable switching device.

FIG. 2 represents schematically a switching device 1. Essentially, the switching device 1 comprises between its input E and its output S a switch 2 whose closed or open state is determined by a non-volatile memory programmable cell 3. A reading voltage $V_{rd}$ or reading current $I_{rd}$ is applied to the cell 3 which provides a voltage $V_{ce}$, or "cell voltage", used to control the switch 2. By convention, a memory cell is called "programmed" when it is naturally conducting and "erased" when it is naturally non conducting. Thus, depending on the state of the cell, the cell voltage $V_{ce}$ is zero or not and the switch 2 is closed or opened.

Figure 3:
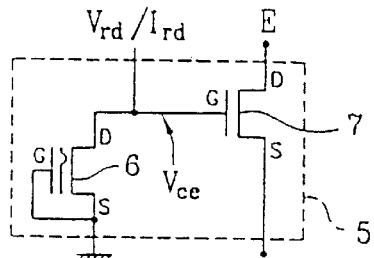
FIG. 3 represents an embodiment of the switching device of FIG. 2.

FIG. 3 represents an embodiment of a programmable switching device 5 wherein the memory cell 3 has the form of a floating gate transistor 6, and the switch 2 the form of a MOS transistor 7. The gate G of the transistor 6 is fed back to its source S which is connected to ground. The drain D receives the reading voltage $V_{rd}$ (or a reading current $I_{rd}$) and is connected to the gate G of transistor 7. The drain D and the source S of transistor 7 form the input E and the output S of the switching device 5. The transistor 6 can be programmed in a conventional way by applying a high voltage $V_{pp}$ of about 12 to 20 V between its drain D and its gate G or erased by applying the high voltage $V_{pp}$ between its gate G and its source S. When the transistor 6 is in the programmed state, electrical charges are trapped in the floating gate and its threshold voltage VT is negative, for example about −4 V. The transistor 6 is then naturally ON and its drain D is therefore connected to ground when the reading voltage $V_{rd}$ is applied. The cell voltage $V_{ce}$ (here, the voltage of the drain D of transistor 6) is zero, and the switch-transistor 7 is blocked (switch open). At contrary, when the transistor 6 is in the erased state, the threshold voltage VT is positive, for example about +6 V. The transistor 6 is naturally blocked, its drain D being not conductive. The cell voltage $V_{ce}$ is equal to the reading voltage $V_{rd}$ and the switch-transistor 7 is ON (switch closed).

Figure 4:
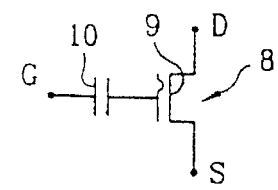
FIG. 4 represents another embodiment of the switching device of FIG. 2.

The programming switching device described here-above may, of course, be designed with any other kind of memory cell. For example, in FIG. 4, a memory cell 8 is designed with a MOS transistor 9 whose gate is biased by a capacitor 10 in which electrical charges can be trapped. Also, cells which are electrically programmable and erasable by means of ultraviolet light can be used.

The application of such a switching device to the adjusting of the resonance frequency of the LC circuit of an electronic chip supplied by induction is one aspect of the present invention.

Figure 5:
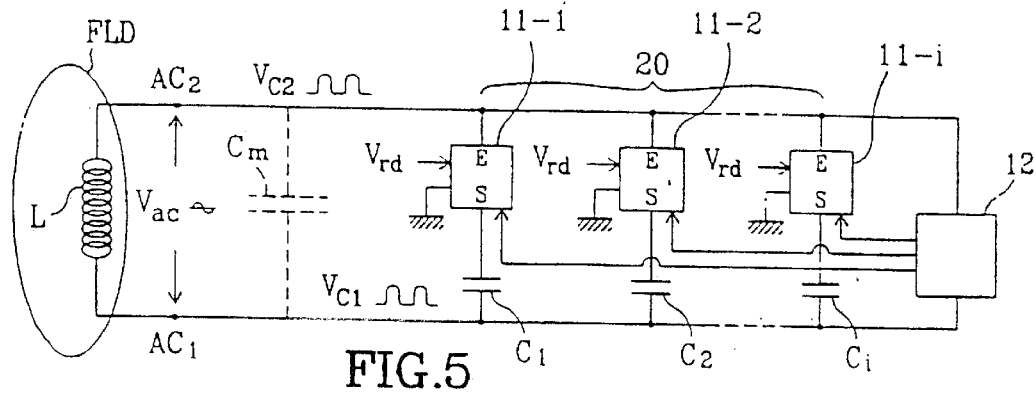
FIG. 5 shows a LC resonant circuit according to the invention, comprising programmable switching devices shown in block form.

Thus, FIG. 5 represents a programmable capacity 20 comprising a plurality of capacities C1, C2, . . . Ci connected in parallel between two common terminals AC1, AC2 by means of a plurality of programmable switching devices 11-1, 11-2, . . . 11-i. A primary capacity Cm represented in dotted line can be provided, depending on the searched adjusting range. The capacity 20 is associated with a coil L to form the LC resonant circuit of an electronic chip. This resonant circuit enables the chip to receive by electromagnetic induction an AC voltage Vac used as an electrical energy source and, if necessary, as a carrier for emitting and receiving data. With the present invention, the tuning of the LC circuit can be performed once the coil has been connected and the chip powered on, so as to take into account mistakes about the value of the coil L and the chip stray capacities. Furthermore, the tuning can be automatically performed by an electronic block 12 integrated in the chip, which reads the AC voltage $V_{ac}$ on the terminals AC1 and AC2 and automatically programmes the switching devices 11-1 to 11-i till the highest AC voltage $V_{ac}$ is obtained, the coil L being surrounded by an alternating magnetic field FLD. The present invention provides thus, advantageously, to tune the resonant circuit LC once the chip has been separated from the wafer, the coil L having been soldered to the chip and the whole mounted on a support or in a housing.

In such an application, a problem may arise if the switching devices 11 receive on their inputs E and their outputs S an AC voltage $V_{ac}$ having a peak value higher than the reading voltage $V_{rd}$. In this case, the gate voltage $V_G$ of the switch-transistor 7 (FIG. 3) becomes indeed less than the conductive threshold voltage $V_T$ during a half-wave of the voltage $V_{ac}$, and the transistor 7 turns OFF. For example, in the case of a contactless chip card or an electronic label receiving digital data by means of the resonant circuit LC of FIG. 5, the induced voltage $V_{ac}$ appearing between the terminals AC1, AC2 may reach 18 V peak to peak. At contrary, the reading voltage $V_{rd}$ of a memory cell is usually about 3 to 4 V only when it is generated from the supply voltage of an integrated circuit.

According to the invention, this drawback is reduced by arranging, between the switch-transistor 7 and the cell 6, means for controlling the transistor 7 which receive the cell voltage $V_{ce}$ as an input and produce a control voltage of transistor 7 higher than the cell voltage $V_{ce}$. These control means may, for example, be in the form of a booster circuit like a charge pump. However, a charge pump presents generally a rather long starting time and is not easy to use in the application according to the invention, as the resonant circuit has to be operative rapidly when the reading voltage $V_{rd}$ appears.

Figure 6:
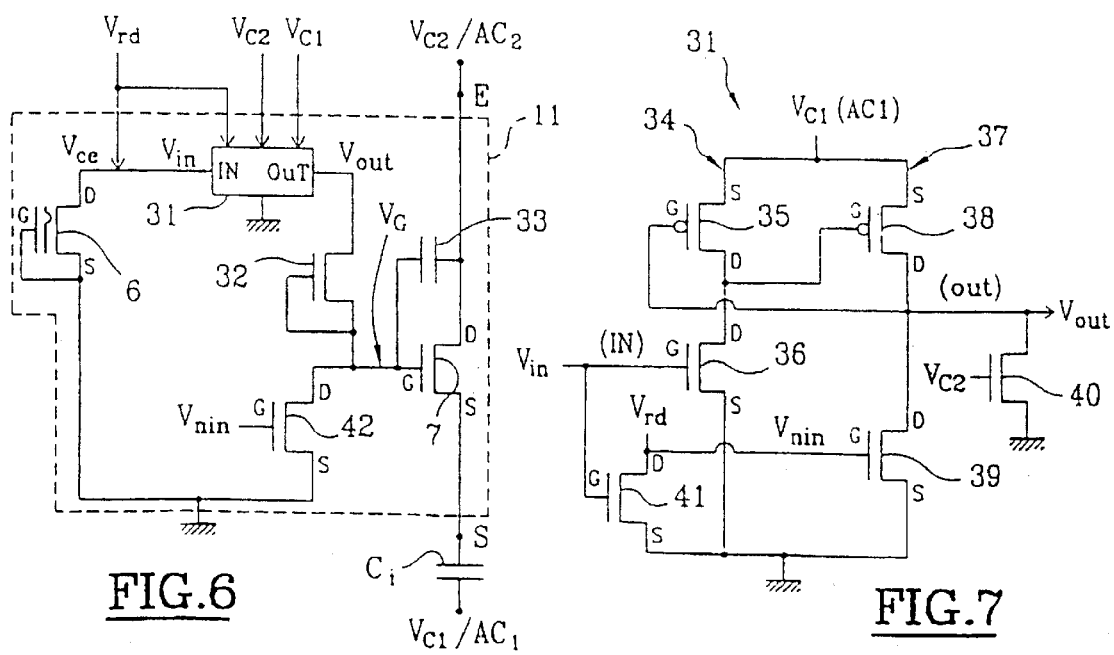
FIG. 6 is the electrical diagram of a programmable switching device according to the invention.

FIG. 6 shows an embodiment 11 according to the invention of the switching devices 11-1 to 11-i of FIG. 5 which does not have this drawback. The switching device 11 comprises the floating gate transistor 6 and the switch-transistor 7 already described. The source S of the transistor 7 is connected to the terminal AC1 by means of a capacity C1 and receives a half-wave $V_{c1}$ of the AC voltage $V_{ac}$. The drain D is connected to the terminal AC2 and receives the other half-wave $V_{c2}$. The drain D of the floating gate transistor 6 is connected to the input IN of a voltage adapter stage 31 which will be described later. The input IN of the stage 31 receives an input voltage $V_{in}$ equal to the cell voltage $V_{ce}$, which is itself equal to the reading voltage $V_{rd}$ when the transistor 6 is in an erased state. The output OUT of the stage 31 provides a voltage $V_{out}$ applied to the gate G of the transistor 7 by means of a MOS transistor 32 working as a diode. Lastly, the gate G of the transistor 7 is connected to a boosting capacity 33 whose role will be described later. The free terminal of the capacity 33 is connected to the drain D of transistor 7 so as to receive the half-wave $V_{c2}$.

Figure 7:
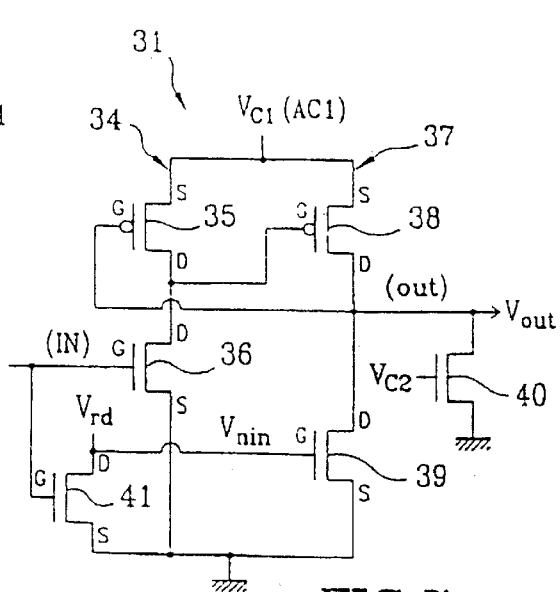
FIG. 7 represents in a detailed way an element of the switching device of FIG. 6.

The adapter stage 31, represented with details in FIG. 7, comprises two parallel branches 34, 37, one end of which receives the half-wave $V_{c1}$ and whose other end is connected to ground. The branch 34 comprises a PMOS transistor 35 and a NMOS transistor 36 arranged in series and the branch 37 a PMOS transistor 38 and a NMOS transistor 39. The gate G of transistor 35 is connected to the drains D of the transistors 38, 39 and the gate of the transistor 38 is connected to the drain D of the transistor 35. The voltage $V_{out}$ is taken on the drains D of the transistors 38, 39, which are otherwise coupled to ground by means of a NMOS transistor 40 receiving the half-wave $V_{c2}$ of the voltage $V_{ac}$ on its gate G. Lastly, the input voltage $V_{in}$ is applied to the gate G of the transistor 36 and an inverted voltage $V_{nin}$ of the voltage $V_{in}$ is applied to the gate G of the transistor 39. The voltage $V_{nin}$ is taken on the drain D of a NMOS transistor whose source S is connected to ground, this transistor being biased by the reading voltage $V_{rd}$ and driven by the voltage $V_{in}$. Thus, when $V_{in}$ is at 1 (that is equal to the reading voltage $V_{rd}$), the voltage $V_{nin}$ is at 0 (that is to ground) and inversely.

When the voltage $V_{in}$ is at 1 (transistor 6 in an erased state) the transistors 36 and 38 are ON and the output voltage $V_{out}$ copies out the half-wave $V_{c1}$ during the duration of this half-wave and is set to 0 during the half-wave $V_{c2}$ by the transistor 40 which turns ON. When the voltage $V_{in}$ is at 0 (transistor 6 in the programmed state) the transistor 39 is conductive and the output $V_{out}$ is maintained at 0, the switch-transistor 7 being thus blocked (which corresponds to the cutting of a conductive path in the prior art). When the voltage $V_{in}$ is at 1, the switching off of the switch-transistor 7 is ensured by the boosting capacity 33 which is then charged with the value:

$$[V_{clmax} - V_t],$$

$V_{clmax}$ being the peak value of the half-wave Vc1 and Vt the threshold voltage of the diode-transistor 32, whose role is to prevent the capacity 33 from discharging.

During a half-wave $V_{C1}$, the gate voltage $V_G$ of the transistor 7 is thus brought to a level N1 equal to $$N1 = [V_{clmax} - Vt]$$

and, during a half-wave $V_{c2}$, to a level N2 equal to $$N2 = N1 + V_{c2}$$

because the boosting capacity receives on its other terminal the half-wave $V_{c2}$.

Thus, the switch-transistor 7 is always ON and works in a bi-directional way whatever the amplitude of the AC voltage Vac may be, the gate voltage $V_G$ being proportional to the peak voltage $V_{clmax}$. To have a better idea, the working of the switching device 11 is summarised in the table hereafter.

Of course, the working of the switching device 11 can be inverted by driving the gate G of the transistor 39 with the voltage $V_{in}$ and the one of the transistor 36 with the voltage $V_{nin}$. In this case, the switching device is open (non-conductive) when $V_{in}$ is at 1 (transistor 6 in the erased state) and closed (conductive) when $V_{in}$ is at 0 (transistor 6 programmed).

TABLE

| | value of $V_{out}$ | | value of $V_G$ of transistor 7 | |
|---|---|---|---|---|
| | half-wave $V_{c1}$ | half-wave $V_{c2}$ | half-wave $V_{c1}$ | half-wave $V_{c2}$ |
| $V_{in} = 0$ | 0 | 0 | 0 | 0 |
| $V_{in} = 1$ | $V_{c1}$ | 0 | $V_{c1max} - V_T$ | $V_{c1max} - V_t + V_{c2}$ |

The capacity 33 is called "boosting capacity" (or "boost" capacity) because the half-wave $V_{c2}$ is applied to its free terminal so as to bring the gate voltage $V_G$ to the level N2, which allows to turn ON the transistor 7 during the half-wave Vc2, as it has just been described.

However, according to an alternative, the capacity 33 may be used as a mere integrator, without the boosting function. In this case, the free terminal of capacity 33 is connected to ground and the transistor 7 is conducting only during the half-wave $V_{c1}$. A second switch-transistor 7, driven by a second adapter stage 31 providing the half-wave $V_{c2}$ at its output OUT, may then be provided to let the half-wave $V_{c2}$ pass through. Such a "push-pull" structure with two switch-transistors 7 and two adapter stages 31 may be used when the circuit which has just been described is designed with switches 7 with one conducting direction only, for example with bipolar transistors.

Lastly, and as illustrated in FIG. 6, a transistor 42 is provided to maintain at 0 the voltage $V_G$ of the transistor 7 when the signal $V_{in}$ is at 0. This transistor 42 is connected between the gate of the transistor 7 and ground and is for example driven by the voltage $V_{nin}$, which has already been described.

Figure 8:
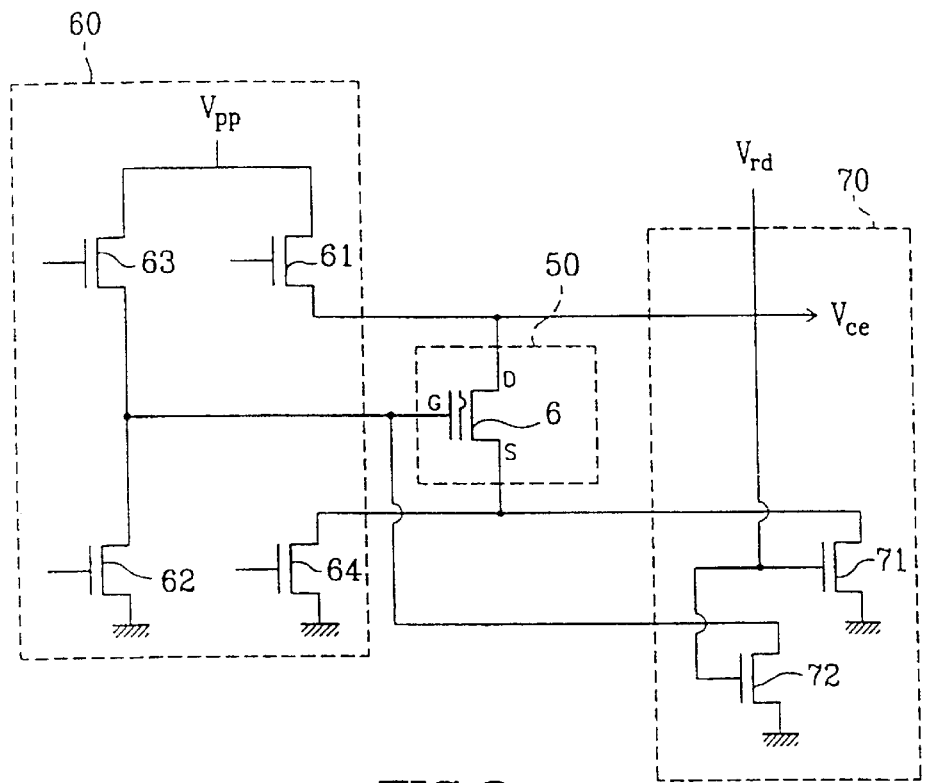
FIG. 8 is the electrical diagram of a circuit allowing the programming or the activation of a switching device according to the invention.

FIG. 8 represents an example of connection, in an integrated circuit, of a memory cell 50 comprising the floating gate transistor 6 already described. Are present a first group 60 of four switches 61, 62, 63, 64 for programming or erasing the cell 50 and a group 70 of two switches 71, 72 for reading the cell. When programming, the floating gate transistor 6 receives on its drain D a high voltage $V_{pp}$ applied by means of the transistor 61 and its gate G is connected to ground by the transistor 62, the transistors 63, 64 being not conducting. When erasing, the floating gate transistor 6 receives the high voltage $V_{pp}$ on its gate G, applied by means of the transistor 63 and its source S is connected to ground by the transistor 64, the transistors 61 and 62 being not conducting. Lastly, when reading, the gate G and the source S of the floating gate transistor 6 are connected to ground by the transistors 71, 72 whose gates G receive the reading voltage $V_{rd}$. Simultaneously, the reading voltage $V_{rd}$ is applied to the drain D of the transistor 6, on which is found the cell voltage $V_{ce}$, equal to 0 or to $V_{rd}$ according to the transistor state. Of course, the reading voltage $V_{rd}$ is inhibited during the programming or erasing periods. Furthermore, in practice, the memory cells of several switching devices according to the invention may be arranged in rows and be accessible by means of multiplexing circuits for the application of the programming or erasing high voltage $V_{pp}$.

Figure 9:
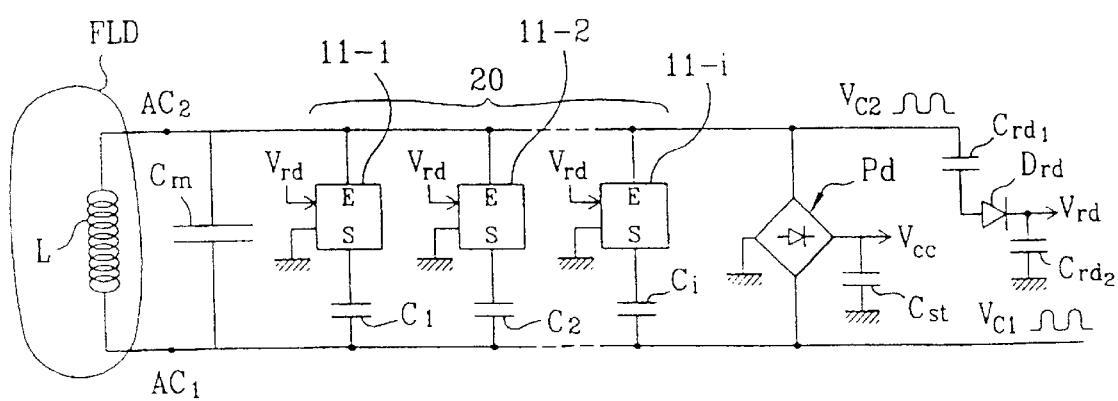
FIG. 9 represents the resonant circuit of an electronic chip according to the invention.

FIG. 9 represents a resonant circuit LC of a contactless chip supplied by electromagnetic induction. The LC circuit is identical with the one described in FIG. 5 and the programmable capacity 20 comprising the switching devices 11-1 to 11-i according to the invention is present. The chip is supplied by a voltage $V_{cc}$ provided by a diode rectifier bridge Pd which receives the induced AC voltage $V_{ac}$ at its input. A filtering capacity $C_{st}$ with a large value is provided at the output of the rectifier bridge Pd to provide a charge store able to stabilise the voltage $V_{cc}$ in the case of a bad energy reception.

Assume now that the LC circuit has already been tuned by a convenient programming of the switching devices 11-1 to 11-i, for example by means of the electronic block 12 of FIG. 5, and that the chip is suddenly inside an alternating magnetic field FLD after having been powered off.

The problem which arises then is that the switching devices 11-1 to 11-i must be operative in order that the circuit LC is tuned at the oscillation frequency of the magnetic field. However, the switching devices 11-1 to 11-i are operational only when the reading voltage $V_{rd}$ is applied to them, and the supply voltage $V_{cc}$ only appears slowly due to the time required for charging the capacity $C_{st}$. Thus, if the voltage $V_{cc}$ is used as the reading voltage $V_{st}$ of the switching devices 11-1 to 11-i, the time to power the chip may be very long. In the worst case, if the LC circuit is greatly out of tuning before the activation of the switching devices, and if the induced voltage $V_{ac}$ is not sufficient to charge the capacity Cst, the supply voltage $V_{cc}$ may not appear.

To avoid this drawback, the present invention provides an auxiliary rectifying circuit to deliver the reading voltage $V_{rd}$ of the switching devices. This auxiliary rectifying circuit comprises a filtering capacity of low value so that the reading voltage $V_{rd}$ will appear rapidly after the first oscillations of the induced voltage $V_{ac}$, even if these oscillations have a small energy and the LC circuit is badly tuned. A particularly simple embodiment of the auxiliary circuit, shown in FIG. 9, consists in performing a half-wave rectifying of the induced voltage $V_{ac}$ by means of a diode $D_{rd}$ and a low value capacity $C_{rd2}$. Preferably, the diode $D_{rd}$ is connected to the one or the other of the terminals AC1, AC2 of the coil by means of a capacity $C_{rd1}$ allowing the limitation of the reading current $I_{rd}$ sent to the memory cells of the switching devices 11-1 to 11-i.

It will be apparent to the man skilled in the art that the present invention can have numerous alternative embodiments and improvements. In particular, it can be provided that each programmable switching device according to the invention comprise several cells arranged in series, in parallel or in parallel-series, if a large reliability level is required. Also, there can be found, in a switching device according to the invention, several switches working in a complementary or in the same way, as described above. Finally, the AC programmable switching device according to the present invention can also have various other applications, like the design of programmable resistors, programmable RC circuits, . . .

It will be appreciated by those skilled in the art that changes could be made to the embodiment(s) described above without departing from the broad inventive concept thereof. It is understood, therefore, that this invention is not limited to the particular embodiment(s) disclosed, but it is intended to cover modifications within the spirit and scope of the present invention as defined by the appended claims.

We claim:

1. Integrated circuit comprising a resonant circuit (L, 20) tuneable to a predetermined resonance frequency for receiving, by electromagnetic induction, an AC voltage ($V_{ac}$) constituting the source of energy of the integrated circuit, said resonant circuit comprising of at least a tuning capacity (C1–Ci) able to be switched by means of a programmable switching device (11) comprising switching means (7) for switching the AC voltage ($V_{ac}$), a memory cell (6), and means (31, 32, 33, 42) electrically connected to the memory cell, for controlling the switching means (7), to open or close the switching means (7) depending on the programming or erasing state of the memory cell (6).

2. Integrated circuit according to claim 1, wherein the control means comprise means (31, 32) for providing, according to the programming state of the memory cell (6), at least a first half-wave ($V_{c1}$) of the AC signal ($V_{ac}$).

3. Integrated circuit according to claim 2, wherein the output of the means (31, 32) for providing least a first half-wave ($V_{c1}$) of the AC signal ($V_{ac}$) is connected to a first terminal of a capacity (33) whose second terminal is designed to receive the other half-wave ($V_{c2}$) of the AC signal ($V_{ac}$).

4. Integrated circuit according to claim 2, wherein the output of the means (31, 32) for providing at least a first half-wave ($V_{c1}$) of the AC signal ($V_{ac}$) is connected to a first terminal of a capacity (33) whose second terminal is connected to the ground of the integrated circuit.

5. Integrated circuit according to claim 1, wherein the switching means comprises a MOS transistor (7).

6. Integrated circuit according to claim 1, wherein the memory cell (6) is electrically erasable and programmable.

7. Integrated circuit according to claim 1, wherein the memory cell comprises a floating gate transistor (6).

8. Integrated circuit according to claim 1, comprising means ($C_{rd}$, $D_{rd}$) with a low filtering capacity ($C_{rd}$) for rapidly rectifying the AC voltage ($V_{ac}$), in order to produce a reading voltage ($V_{rd}$) of the memory cell (6).

9. Integrated circuit according to claim 1, comprising means (12, 60, 70) for automatically programming the programmable switching device (11), in order to receive the highest AC voltage ($V_{ac}$).

* * * * *